(12) United States Patent
Kim et al.

(10) Patent No.: US 7,696,525 B2
(45) Date of Patent: Apr. 13, 2010

(54) SURFACE MOUNTING DEVICE-TYPE LIGHT EMITTING DIODE

(75) Inventors: Yong Sik Kim, Gyeonggi-Do (KR); Seog Moon Choi, Seoul (KR); Hyun Ho Kim, Gyeonggi-Do (KR)

(73) Assignee: Samsung Electro-Mechanics Co., Ltd., Suwon-Si, Gyunggi-Do (KR)

( * ) Notice: Subject to any disclaimer, the term of this patent is extended or adjusted under 35 U.S.C. 154(b) by 0 days.

(21) Appl. No.: 11/736,159

(22) Filed: Apr. 17, 2007

(65) Prior Publication Data

US 2007/0246728 A1    Oct. 25, 2007

(30) Foreign Application Priority Data

Apr. 21, 2006    (KR) ...................... 10-2006-0036201

(51) Int. Cl.
    *H01L 21/00* (2006.01)
(52) U.S. Cl. ............................... 257/98; 257/99; 438/22
(58) Field of Classification Search ............... 257/99, 257/98; 438/22
    See application file for complete search history.

(56) References Cited

U.S. PATENT DOCUMENTS

| 6,610,598 B2 | 8/2003 | Chen |
| 2003/0089914 A1 | 5/2003 | Chen |
| 2003/0173568 A1 | 9/2003 | Asakawa et al. |

FOREIGN PATENT DOCUMENTS

| JP | 2003-234509 A | 8/2003 |
| JP | 2004-235337 A | 8/2004 |
| JP | 2005-294736 A | 10/2005 |
| KR | 10-2004-0104178 A | 10/2004 |

OTHER PUBLICATIONS

German Patent Office, Office Action.

*Primary Examiner*—Douglas M Menz
(74) *Attorney, Agent, or Firm*—Lowe Hauptman Ham & Berner

(57) ABSTRACT

A surface mounting device-type light emitting diode (SMD-type LED) comprises a lead frame composed of a pair of lead terminals; a package housing a portion of the lead frame therein, the package having an emission window which is opened so that light is emitted through the emission window; an LED chip mounted on the lead frame inside the package; a wire for electrically connecting the LED chip and the lead frame; and a molding material filled in the package, the molding material having surface irregularities with a predetermined shape formed on the surface thereof which is exposed through the emission window of the package.

8 Claims, 5 Drawing Sheets

SURFACE MOUNTING DEVICE-TYPE LIGHT EMITTING DIODE

CROSS-REFERENCE TO RELATED APPLICATIONS

This application claims the benefit of Korean Patent Application No. 10-2006-0036201 filed with the Korean Intellectual Property Office on Apr. 21, 2006, the disclosure of which is incorporated herein by reference.

BACKGROUND OF THE INVENTION

1. Field of the Invention

The present invention relates to a surface mounting device-type light emitting diode (hereinafter, referred to as an SMD-type LED) which can enhance extraction efficiency of light to be emitted into the surface of a molding material which is exposed through an emission window of a package.

2. Description of the Related Art

Generally, a light emitting diode (hereinafter, referred to as 'LED') has a light source provided by varying compound semiconductor materials such as GaAs, AlGaAs, GaN, InGaInP and the like, thereby implementing various colors of light.

Recently, as the semiconductor technology rapidly develops, the production of LEDs with high luminance and high quality has become possible. Further, as the implementing of blue and white diodes with an excellent characteristic is realized, the use of LED is expanded into a display device, a next-generation lighting source, or the like. For example, SMD-type LEDs are productized.

Now, a conventional SMD-type LED will be described in detail with reference to FIGS. 1 to 4.

FIG. 1 is a schematic view illustrating the structure of a conventional SMD-type LED. The SMD-type LED 100 has a package 120 formed of molding epoxy resin or the like. The package 120 has an emission window formed on a predetermined surface thereof. The emission window is opened so that light is easily emitted through the emission window. On other surfaces of the package 120, a pair of lead terminals 130 is formed to project, the lead terminals 130 composing a lead frame to be mounted on a printed circuit board 110. Further, inside the package 120 constructed in such a manner, an LED chip (not shown) is disposed so that the light emission surface thereof is directed toward the emission window. The pair of lead terminals 130 and the LED chip are electrically connected through a wire (not shown).

FIG. 2 is a sectional view taken along II-II' line of FIG. 1, showing the structure of the conventional SMD-type LED in detail.

As shown in FIG. 2, the conventional SMD-type LED 100 includes the pair of lead terminals 130, the package 120 formed to house a portion of the lead terminal 130 therein, the LED chip 140 mounted on a lead electrode inside the package 120, the wire 150 for electrically connecting the LED chip 140 and the lead electrode, and a molding material 160 filled in the package 120 so as to protect the LED chip 140 and the wire 150.

The molding material 160 for protecting the LED chip 140 is composed of transmissive resin including a transparent material or phosphor, depending on the color of an LED chip 140 to be implemented.

General standards for determining characteristics of LED chips include color, luminance, an intensity range of luminance and the like. Such characteristics are primarily determined by materials of compound semiconductors to be used in LED chips, but are incidentally influenced by the structure of a package for mounting an LED chip and a molding material filled in the package. Particularly, the molding material filled in the package has a large effect on the distribution of luminance.

In the conventional SMD-type LED, some of light is internally totally-reflected on the surface of the molding material, because of a large difference in refractive index between the molding material and the air, that is, at the interface with the vacuum, as shown in FIG. 3. In this case, the intensity of light to be emitted from the LED chip decreases, compared with that of light to be emitted from the LED chip without the molding material. Therefore, light efficiency decreases.

FIG. 3 is a conceptual diagram for explaining the reduction in luminance of an LED which is caused by the internal total reflection at the interface between the molding material and the vacuum.

Therefore, a new technique is being required, which minimizes internal total reflection of light caused by a molding material so as to increase the luminous intensity of an LED chip.

In the related art, a hemispheric lens 180 is attached to the surface of the molding material 160, which is exposed through the emission window of the package 120, by using a bonding layer 170, as shown in FIG. 4. Therefore, light to be emitted from the LED chip 140 is prevented from being internally totally-reflected on the surface of the molding material 160. Simultaneously, a light path is adjusted so that light extraction efficiency can be enhanced.

In the above-described SMD-type LED, however, the overall height thereof increases because of the lens 180. Therefore, the SMD-type LED cannot be used in a product having a limit in height. Further, water, ultraviolet (UV) or the like permeates through the bonding layer 170, thereby degrading reliability and characteristic.

Further, in order to attach the lens 180 to the surface of the molding material 160, additional separate processes are required, such as a lens manufacturing process, a position aligning process, a bonding process and the like. Such processes increase a manufacturing cost of an LED and increase a time required for the overall manufacturing process, thereby reducing a production yield of an SMD-type LED.

SUMMARY OF THE INVENTION

An advantage of the present invention is that it provides an SMD-type LED which prevents light transmitted through a molding material from being internally totally-reflected on the surface of the molding material exposed through an emission window of a package, thereby enhancing light extraction efficiency.

Additional aspect and advantages of the present general inventive concept will be set forth in part in the description which follows and, in part, will be obvious from the description, or may be learned by practice of the general inventive concept.

According to an aspect of the invention, a surface mounting device-type light emitting diode (SMD-type LED) comprises a lead frame composed of a pair of lead terminals; a package housing a portion of the lead frame therein, the package having an emission window which is opened so that light is emitted through the emission window; an LED chip mounted on the lead frame inside the package; a wire for electrically connecting the LED chip and the lead frame; and a molding material filled in the package, the molding material having surface irregularities with a predetermined shape formed on the surface thereof which is exposed through the emission window of the package.

Preferably, the surface irregularities are composed of one or more lines.

Preferably, the surface irregularities are formed through an ion-beam etching process.

Preferably, the ion-beam etching process is performed by using argon (Ar) as etching ions.

Preferably, the molding material is composed of any one selected from transparent epoxy, silicon, and a phosphor mixture.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
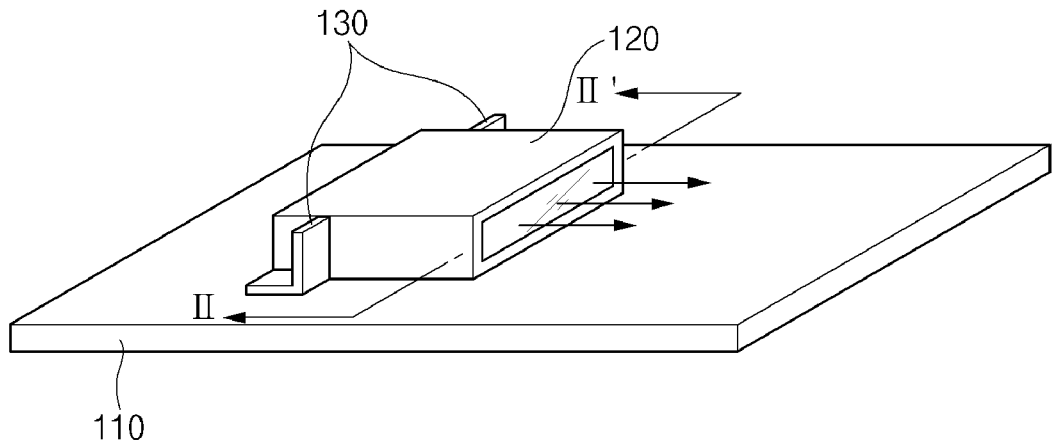
FIG. 1 is a schematic view illustrating the structure of a conventional SMD-type LED.
Figure 2:
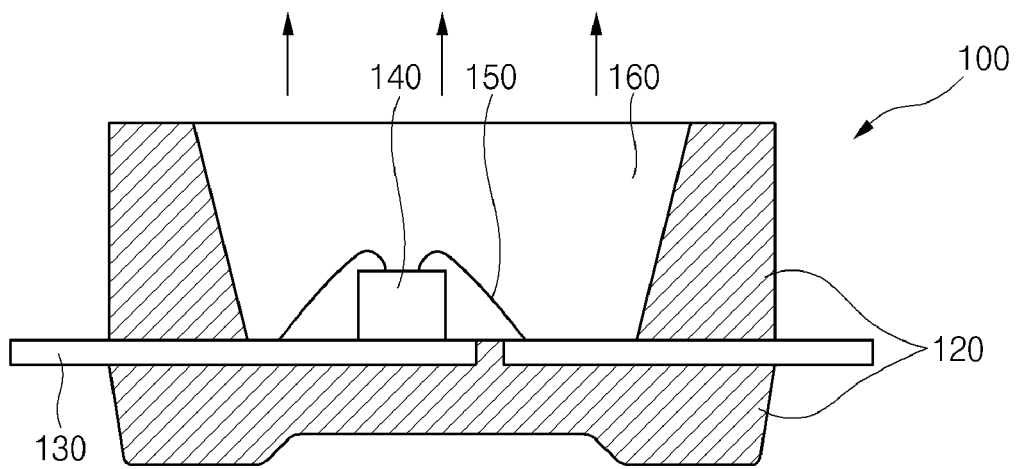
FIG. 2 is a sectional view taken along II-II' line of FIG. 1.

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures. In the drawings, the thicknesses of layers and regions are exaggerated for clarity.

Hereinafter, an SMD-type LED according to an embodiment of the present invention will be described in detail with reference to the accompanying drawings.

Figure 5:
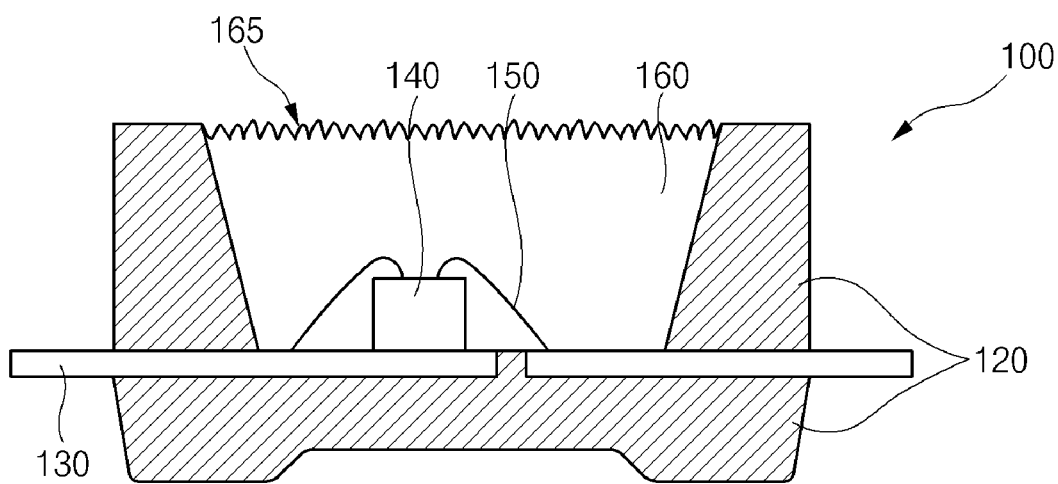
FIG. 5 is a sectional view illustrating the structure of an SMD-type LED according to an embodiment of the invention.

Referring to FIG. 5, an SMD-type LED according to an embodiment of the invention will be described in detail. FIG. 5 is a sectional view illustrating the structure of the SMD-type LED according to an embodiment of the invention.

As shown in FIG. 5, the SMD-type LED 100 has a package 200 composed of transparent or opaque synthetic resin. The package 200 has an emission window formed on a predetermined surface thereof. The emission window is opened so that light is easily emitted through the emission window. On other surfaces of the package 200, portions of a pair of lead terminals 130 are formed to project, the pair of lead terminals 130 composing a lead frame to be mounted on a printed circuit board (not shown).

Inside the package 120 constructed in such a manner, an LED chip 140 is disposed so that a light-emission surface of the LED chip 140 is directed toward the emission window. The lead terminals 130 and the LED chip 140 are connected through a wire 150.

The LED chip 140 is mounted on the lead frame. Inside the package 120 having the LED chip 140 mounted therein, a molding material 160 is filled so as to protect the LED chip 140 and the wire 150. Preferably, the molding material 160 is formed of any one selected from transparent epoxy, silicon, and a phosphor mixture such that light to be emitted from the LED chip 140 is transmitted to the outside.

On the surface of the molding material 160 which is exposed through the emission window of the package 120, surface irregularities 165 with a predetermined shape are formed. When light to be generated from the LED chip 140 is emitted from a dense medium (the molding material 160) to a less dense medium (the air), the surface irregularities 165 serve to increase a critical angle of incident light at the interface between two of the mediums, thereby minimizing a probability of total reflection on the interface.

The surface irregularities 165 are composed of one or more lines and can be formed through an ion-beam etching process. The line may be any one selected from the group consisting of a straight line, a curved line, and a simple closed line.

Figure 6:
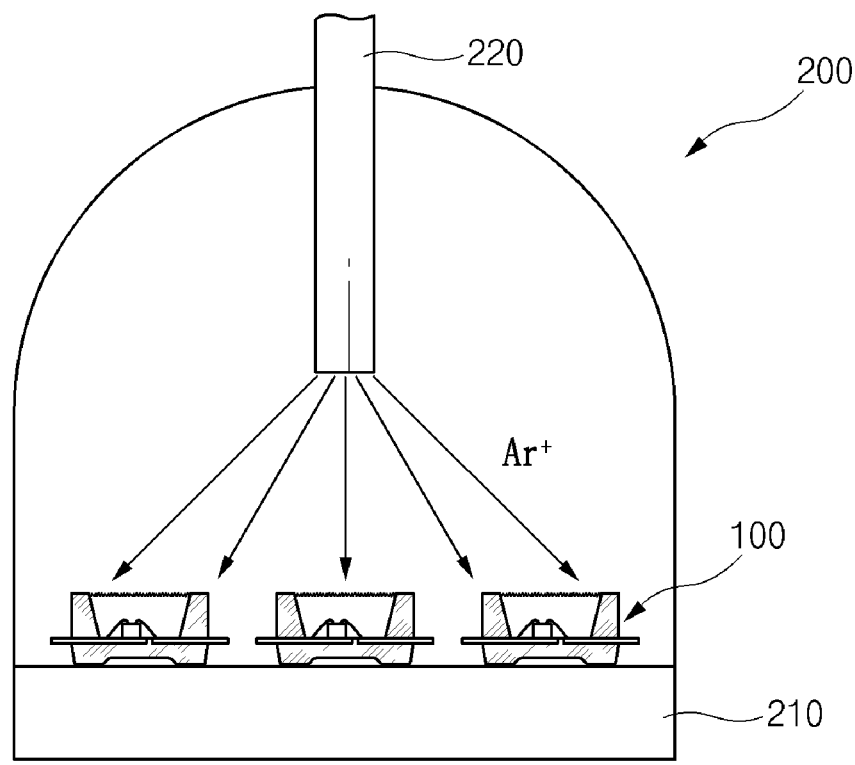
FIG. 6 is a schematic view illustrating a general ion-beam etching chamber.

The surface irregularities 165 are formed through an ion-beam etching process. Such an etching process is performed by using an ion-beam etching chamber 200 shown in FIG. 6. FIG. 6 is a schematic view illustrating a general ion-beam etching chamber.

More specifically, the surface irregularities 165 are formed as follows. A plurality of SMD-type LEDs 100 are loaded on a base plate 210 of the ion-beam etching chamber 200, and etching ions are irradiated on the SMD-type LEDs 100 loaded on the base plate 210 by using an ion gun 220, thereby forming surface irregularities.

Preferably, the ion-beam etching process is physically performed by using argon (Ar) ions as etching ions, in order to prevent etching ions from chemically reacting with a molding material, for example, in order to prevent a molding material from being oxidized.

Preferably, the diameter of an ion beam to be irradiated onto the base plate 200 is set in a range of 10 to 20 cm such that the ion beam can be irradiated on a relatively wide area. When such an ion beam is used, surface irregularities can be easily formed on molding materials of a large number of LEDs or on a molding material of an LED having a large area, through a one-time ion-beam etching process.

Particularly, the surface irregularities according to the invention are formed to have a different depth and width depending on the number of irradiated ions. Therefore, the number of irradiated ions is adjusted in accordance with a characteristic of an LED and a process condition such that optimal light extraction efficiency is achieved.

Figure 7A:
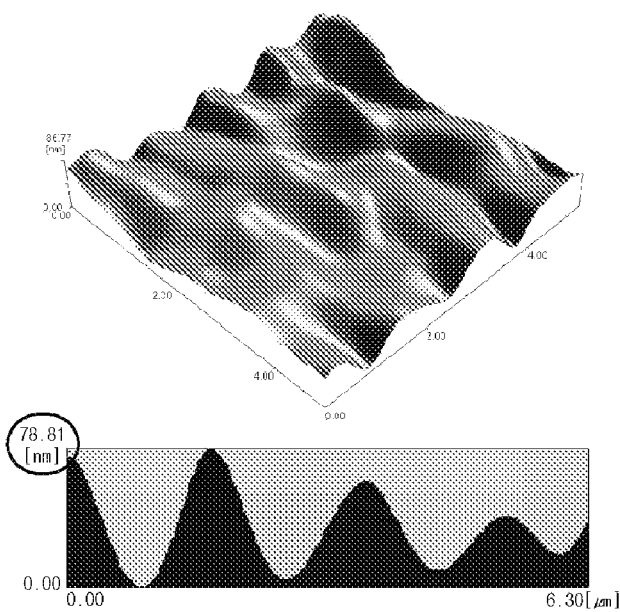
FIGS. 7A to 7C are diagrams showing that the surface state of a molding material is changed depending on the number of irradiated ions.
Figure 7B:
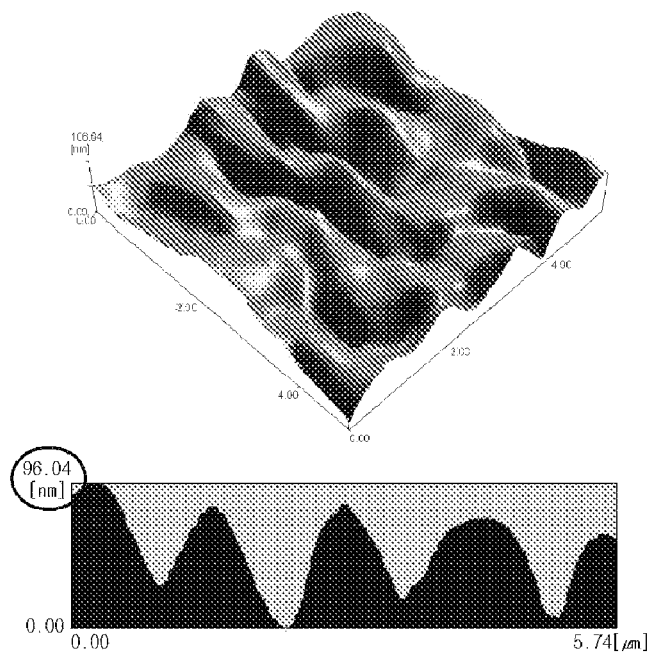
Figure 7C:
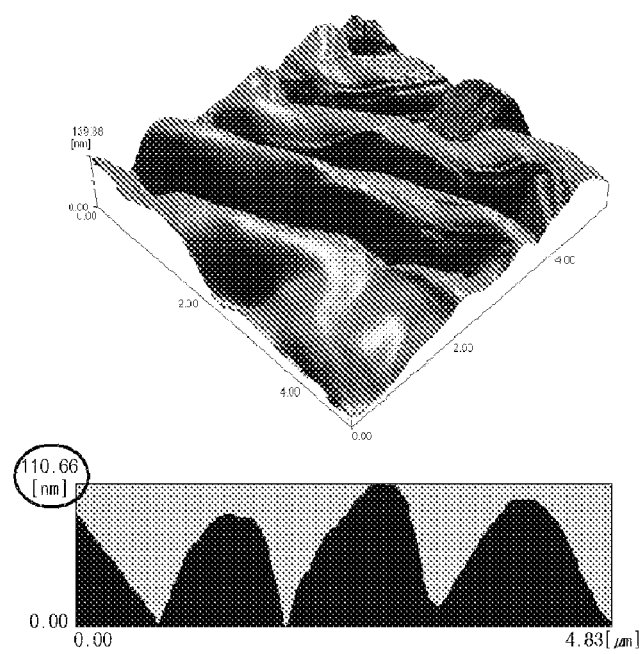

This is can be clearly understood through Table 1 and FIGS. 7A to 7C.

TABLE 1

| number of irradiated ions | pattern depth (µm) | pattern width (nm) | enhancement of light extraction efficiency (%) |
|---|---|---|---|
| 5 × 10e16 | 70 | 1.5 | 5 |
| 1 × 10e17 | 90 | 1 | 12 |
| 5 × 10e17 | 100 | 1 | 17 |

FIGS. 7A to 7C are diagrams showing that the surface state of a molding material is changed depending on the number of irradiated ions shown in Table 1, FIGS. 7A to 7C being composed of AFM (Atomic Force Microscope) photographs and simulation results.

Referring to Table 1 and FIGS. 7A to 7C, it can be found that, as the number of irradiated ions increases, the depth of the irregularity pattern increases and the width thereof decreases. Further, resultant light extraction efficiency increases.

Hereinafter, the action of the surface irregularities of the molding material according to an embodiment of the invention will be described with reference to FIG. 8.

Refraction is referred to as a phenomenon where, when light is incident on a transparent different medium, the light is bent and then propagates straightly. Further, a degree of how much light is bent is referred to as a refractive index. A refractive index which is set by reference to a vacuum state is referred to as an absolute refractive index. The absolute refractive index is generally called just a refractive index.

For example, when a velocity of light in a vacuum is represented as C and a velocity of light in a medium is represented as V, a refractive index is expressed by Equation 1.

Refractive index $n=C/V$ [Equation 1]

TABLE 2

| medium | vacuum | Air (STP)[b] | water | acetone | normal glass | sapphire | high-density glass | diamond |
|---|---|---|---|---|---|---|---|---|
| refractive index[a] | 1.00 | 1.00029 | 1.33 | 1.36 | 1.52 | 1.77 | 1.89 | 2.42 |

[a]value with respect to light (yellow light such as natrium) having a wavelength of 598 nm
[b]STP (standard temperature and pressure at 0° C. and one atmosphere)

As shown in Table 2, a refractive index is always larger than 1.

A medium having a large refractive index means a dense medium, in which light slowly propagates. On the contrary, a medium having a small refractive index means a less dense medium, which is relatively used at all times.

Further, for refraction in a certain medium, a constant rule is established between an incident angle and a refracting angle, which is referred to as the Snell's law.

Figure 8:
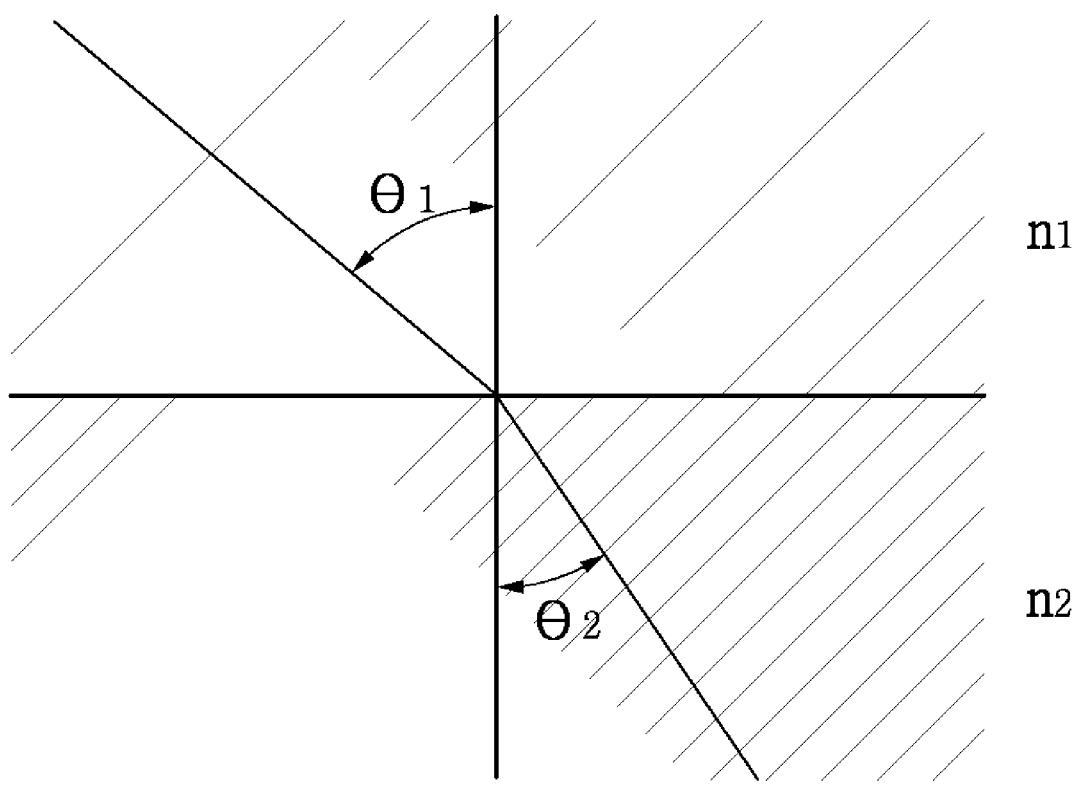
FIG. 8 is a conceptual diagram for explaining the Snell's law to be applied to the invention.

FIG. 8 is a conceptual diagram for explaining the Snell's law to be applied to the invention. Referring to FIG. 8, when light is incident on a dense medium n2 from a less dense medium n1, the light slowly propagates in the dense medium n2. Therefore, the propagation direction of the light is bent toward a vertical line.

Figure 3:
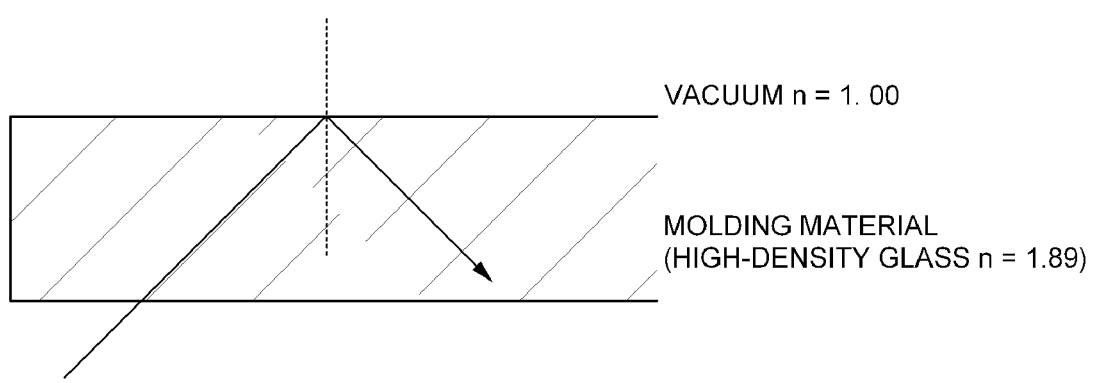
FIG. 3 is a conceptual diagram for explaining the reduction in luminance of an LED which is caused by the internal total reflection at the interface between a molding material and a vacuum.
Figure 4:
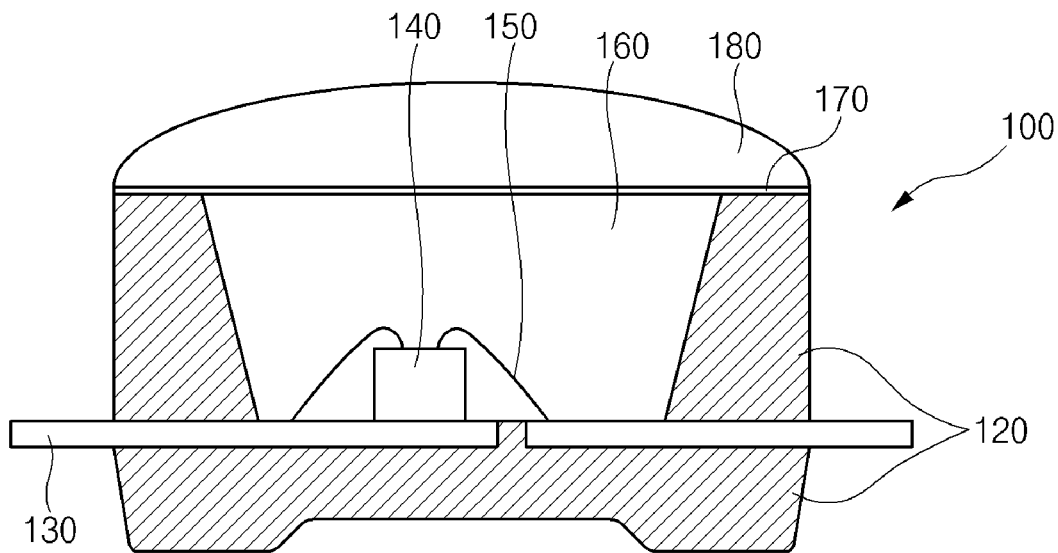
FIG. 4 is a sectional view illustrating the structure of another conventional SMD-type LED.

In the related art, when light is emitted from a dense medium having a large refractive index to a less dense medium having a small refractive index, light incident at more than a certain angle is not refracted but reflected at the interface of the horizon, because the light can not satisfy the Snell's law. Such a phenomenon is referred to as total reflection (refer to FIG. 3). Further, such an angle is referred to as a critical angle. As a difference in refractive index between two mediums increases, a critical angle decreases, and an amount of incident light to be totally reflected increases.

In other words, in order to prevent the total reflection, a critical angle at the interface between different two mediums should be increased.

In this embodiment, the surface irregularities 165 with a predetermined shape are formed on the surface of the molding material 160 as a dense medium such that a critical angle between two mediums is increased by the surface irregularities 165, as shown in FIG. 5. Therefore, when light is emitted from the molding material 160 as a dense medium to the vacuum as a less dense medium, an amount of light to be totally reflected into the molding material 160 can be minimized so that light extraction efficiency of the SMD-type LED is enhanced.

In this embodiment, the technical idea of the invention, where the surface irregularities with a predetermined shape are formed on the surface of the molding material exposed through the emission window of the package such that light to be emitted from the LED chip is prevented from being totally reflected into the molding material, is applied to a side view-type LED. However, the technical idea can be applied to a top view-type LED.

According to the invention, when light is incident from the molding material as a dense medium to the vacuum as a less dense medium, an amount of light to be totally reflected into the molding material is minimized, because a critical angle between two mediums is increased by the surface irregularities formed at the interface between two mediums. Therefore, it is possible to enhance light extraction efficiency of an SMD-type LED.

Further, the surface irregularities are formed through an ion-beam etching process. Therefore, the invention can be applied to various types of SMD-type LEDs. It is possible to enhance a production yield of the SMD-type LEDs.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A surface mounting device-type light emitting diode (SMD-type LED) comprising:
    a lead frame composed of a pair of lead terminals;
    a package housing a portion of the lead frame therein, the package having an emission window which is opened so that light is emitted through the emission window;
    an LED chip mounted on the lead frame inside the package;
    a wire for electrically connecting the LED chip and the lead frame; and
    a molding material filled in the package, the molding material having surface irregularities with a predetermined shape formed on the surface thereof which is exposed through the emission window of the package.

2. The SMD-type LED according to claim 1,
    wherein the surface irregularities are composed of one or more lines.

3. The SMD-type LED according to claim 1,
    wherein the surface irregularities are formed through an ion-beam etching process.

4. The SMD-type LED according to claim 3,
wherein the ion-beam etching process is performed by using argon (Ar) as etching ions.

5. The SMD-type LED according to claim 1,
wherein the molding material is composed of any one selected from transparent epoxy, silicon, and a phosphor mixture.

6. The SMD-type LED according to claim 1, wherein the surface irregularities are formed to have different depths and widths.

7. The SMD-type LED according to claim 1, wherein the surface irregularities form an erratic and irregular surface.

8. A method of forming a surface mounting device-type light emitting diode (SMD-type LED) comprising:
 disposing an LED chip on a lead frame inside a package housing having an emission window which is opened so that light is emitted through the emission window;
 a lead frame composed of a pair of lead terminals;
 filling a molding material in the package;
 irradiating etching ions on the LED using an ion gun to form surface irregularities on an outer surface of the molding material, the surface irregularities formed to have a different depth and width depending upon a number of irradiated ions.

* * * * *